United States Patent
Liao et al.

(10) Patent No.: US 10,937,816 B2
(45) Date of Patent: Mar. 2, 2021

(54) SWITCHING ELEMENT, MANUFACTURING METHOD THEREOF, ARRAY SUBSTRATE AND DISPLAY DEVICE

(71) Applicants: Hefei BOE Optoelectronics Technology Co., Ltd., Anhui (CN); BOE Technology Group Co., Ltd., Beijing (CN)

(72) Inventors: Liqing Liao, Beijing (CN); Hongmin Li, Beijing (CN); Ying Wang, Beijing (CN); Dong Wang, Beijing (CN)

(73) Assignees: Hefei BOE Optoelectronics Technology Co., Ltd., Hefei (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/433,055

(22) Filed: Jun. 6, 2019

(65) Prior Publication Data

US 2019/0312065 A1 Oct. 10, 2019

Related U.S. Application Data

(62) Division of application No. 15/712,988, filed on Sep. 22, 2017, now Pat. No. 10,355,029.

(30) Foreign Application Priority Data

Dec. 1, 2016 (CN) .......................... 201611091732.1

(51) Int. Cl.
| | |
|---|---|
| *H01L 27/12* | (2006.01) |
| *H01L 29/417* | (2006.01) |
| *H01L 29/49* | (2006.01) |
| *H01L 29/51* | (2006.01) |
| *G02F 1/1362* | (2006.01) |
| *G02F 1/1368* | (2006.01) |

(Continued)

(52) U.S. Cl.
CPC ...... *H01L 27/1251* (2013.01); *G02F 1/13624* (2013.01); *H01L 27/124* (2013.01);
(Continued)

(58) Field of Classification Search
CPC ............. H01L 27/1251; H01L 27/3262; H01L 27/124; H01L 27/127; H01L 27/1259;
(Continued)

(56) References Cited

U.S. PATENT DOCUMENTS

| | | | |
|---|---|---|---|
| 2002/0016027 A1* | 2/2002 | Gosain | ............. H01L 29/66757 438/149 |
| 2005/0199881 A1* | 9/2005 | Hoffman | ............ H01L 29/7869 257/72 |

(Continued)

FOREIGN PATENT DOCUMENTS

WO 2015135270 A1 9/2015

*Primary Examiner* — Kyoung Lee
*Assistant Examiner* — Christina A Sylvia
(74) *Attorney, Agent, or Firm* — Banner & Witcoff, Ltd.

(57) ABSTRACT

A switching element, a manufacturing method thereof, an array substrate and a display device are provided. The switching element includes: a base substrate; a first thin-film transistor (TFT), disposed on the base substrate; and a second TFT, disposed on the first TFT, wherein the first TFT includes a first electrode and a second electrode, and the first TFT and the second TFT share the first electrode and the second electrode.

18 Claims, 7 Drawing Sheets

(51) Int. Cl.
    *H01L 27/32* (2006.01)
    *H01L 29/45* (2006.01)
(52) U.S. Cl.
    CPC ...... *H01L 27/127* (2013.01); *H01L 29/41733* (2013.01); *H01L 29/495* (2013.01); *H01L 29/517* (2013.01); *G02F 1/1368* (2013.01); *H01L 27/3262* (2013.01); *H01L 29/45* (2013.01)
(58) Field of Classification Search
    CPC ........... H01L 27/1214; H01L 29/41733; H01L 29/495; H01L 29/517; H01L 29/459; G02F 1/1368; G02F 1/13624
    See application file for complete search history.

(56) References Cited

U.S. PATENT DOCUMENTS

| | | | |
|---|---|---|---|
| 2005/0199960 A1* | 9/2005 | Hoffman | H01L 29/7869 257/368 |
| 2011/0299318 A1* | 12/2011 | Kaneko | H01L 29/516 365/145 |
| 2013/0134522 A1* | 5/2013 | Bhuwalka | H01L 27/0886 257/369 |
| 2013/0240886 A1* | 9/2013 | Yeh | H01L 27/1251 257/57 |
| 2015/0364500 A1* | 12/2015 | Cheng | H01L 27/124 257/59 |
| 2016/0307986 A1* | 10/2016 | Gai | H01L 27/1255 |

* cited by examiner

SWITCHING ELEMENT, MANUFACTURING METHOD THEREOF, ARRAY SUBSTRATE AND DISPLAY DEVICE

This application is a divisional of U.S. patent application Ser. No. 15/712,988 filed Sep. 22, 2017, which claims priority to Chinese Patent Application No. 201611091732.1 filed on Dec. 1, 2016. The present application claims priority to and the benefit of the above-identified applications and the above-identified applications are incorporated by reference herein in their entirety.

TECHNICAL FIELD

Embodiments of the present invention relate to a switching element, a manufacturing method thereof, an array substrate and a display device.

BACKGROUND

With the development of liquid crystal display technology, the current consumer has higher and higher requirement on product resolution. Products with high resolution have gradually become the mainstream in the market. High resolution means that the charging time for each row of pixels in an equipment must be shortened, and the on-state current of corresponding switching element (e.g., thin film transistor (TFT)) must increase, so as to charge and discharge a pixel electrode in a shorter period of time. In the aspect of the structural design of an array substrate, the mostly direct method of increasing the on-state current of the switching element is to increase the width-to-length (W/L) ratio of the switching element. For instance, higher W/L ratio may be obtained by increasing the size of a single switching element or using a plurality of switching elements in parallel connection. However, in the case of increasing the W/L by these means, an area used for displaying in each pixel region is occupied, so the aperture ratio of the pixel region may be reduced.

SUMMARY

At least one embodiment of the present disclosure provides a switching element, a manufacturing method thereof, an array substrate and a display device, so as to solve the above problem. In the switching element, the two TFTs are arranged in parallel connection up and down, so an overall current flux in the on-state can be increased; the up-and-down arrangement can reduce the occupied space of the switching element; and the two TFTs share the source-drain electrode, so as to simplify the manufacturing process of the switching element and reduce the cost.

At least one embodiment of the present invention provides a switching element, comprising: a base substrate; a first thin-film transistor (TFT), disposed on the base substrate; and a second TFT, disposed on the first TFT, wherein the first TFT includes a first electrode and a second electrode, and the first TFT and the second TFT share the first electrode and the second electrode.

For example, the first active layer is disposed on the base substrate, the common gate electrode is disposed between the first gate insulating layer and the second gate insulating layer, the first electrode and the second electrode are between the first active layer and the second active layer.

For example, the switching element further comprises a buffer layer which is disposed on the base substrate, the first active layer is disposed on the buffer layer, the first TFT and the second TFT are disposed on the buffer layer.

For example, the first electrode and the second electrode are disposed in an identical layer, an first orthographic projection of the common gate electrode on the base substrate is located between an second orthographic projection of the first electrode and an third orthographic projection of the second electrode on the base substrate, and the first orthographic projection is not overlapped with the second orthographic projection and the third orthographic projection.

For example, the first electrode and the second electrode comprise first portions overlapped with the first gate active layer and the second gate active layer and extension portions, thicknesses of the first portions is equal to a sum of thicknesses of the common gate electrode, the first gate insulating layer, the second gate insulating layer, the first ohmic contact layer and the second ohmic contact layer.

For example, an upper surface of the first portion of the first electrode and an upper surface of the first portion of the second electrode are coplanar, and a lower surface of the first portion of the first electrode and a lower surface of the first portion of the second electrode are coplanar.

For example, side edges of the first ohmic contact layer away from the common gate electrode are aligned with side edges of the first gate active layer, and side edges of the second ohmic contact layer away from the common gate electrode are aligned with side edges of the second gate active layer.

For example, cross-section shapes of the first electrode and the second electrode are T-like shapes.

For example, the T-like shape is a normal T-like shape or an inverse T-like shape.

For example, the first gate active layer is disposed on the buffer layer, the first ohmic contact layer and the first gate insulating layer are disposed on the first gate active layer, the first electrode and the second electrode are disposed on and directly contact the first ohmic contact layer, the common gate electrode is disposed on the first gate insulating layer, the second gate insulating layer is disposed on the common gate electrode, the second ohmic contact layer is disposed on the second insulating layer and the first electrode and the second electrode, the second gate active layer is disposed on the second gate insulating layer and the second ohmic contact layer.

For example, the first ohmic layer directly contacts the first gate insulating layer, and the second ohmic contact layer directly contacts the second insulating layer.

For example, in a direction parallel to a plane on which the base substrate is disposed, a first insulating layer is disposed between the first electrode and the common gate electrode, and a second insulating layer is disposed between the second electrode and the common gate electrode.

For example, heights of the first insulating layer and the second insulating layer are less than heights of the first electrode and the second electrode.

For example, orthographic projections of the first active layer and the second active layer on the base substrate coincide, orthographic projections of the first ohmic contact layer and the second ohmic contact layer on the base substrate coincide, orthographic projections of the first gate insulating layer and the second gate insulating layer coincide.

For example, in a direction parallel to a plane on which the base substrate is disposed, the first ohmic contact layer and the second ohmic contact layer extend toward the common gate electrode and go beyond the first electrode and the second electrode, and partially overlap with the common gate electrode.

At least one embodiment of the present invention provides an array substrate, comprising a plurality of subpixel units, wherein each subpixel unit includes at least one gate line, a data line, a pixel electrode and the switching element as mentioned above, and the at least one gate line is electrically connected with the first TFT and the second TFT of the switching element, the data line is electrically connected with the first electrode, and the pixel electrode is electrically connected with the second electrode.

At least one embodiment of the present invention provides a display device, comprising the array substrate as mentioned above.

At least one embodiment of the present invention provides a method for manufacturing a switching element, comprising: providing a base substrate; forming a first TFT on the base substrate; and forming a second TFT on the first TFT, wherein the first TFT includes a first electrode and a second electrode, and the first TFT and the second TFT share the first electrode and the second electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

In order to improve a resolution of equipment, a charging time for each row of pixels in the equipment needs to be shortened, namely an on-state current of a switching element needs to be increased. The mostly direct method of increasing the on-state current of the switching element in a pixel unit is to increase a width-to-length (W/L) ratio of the switching element. The current methods for increasing the W/L ratio of the switching element are various, for instance, increasing a size of a single switching elements or connecting a plurality of switching elements in parallel. But the above methods will reduce an area used for displaying in a pixel region, and hence reduce the aperture ratio of the pixel region.

Figure 1:
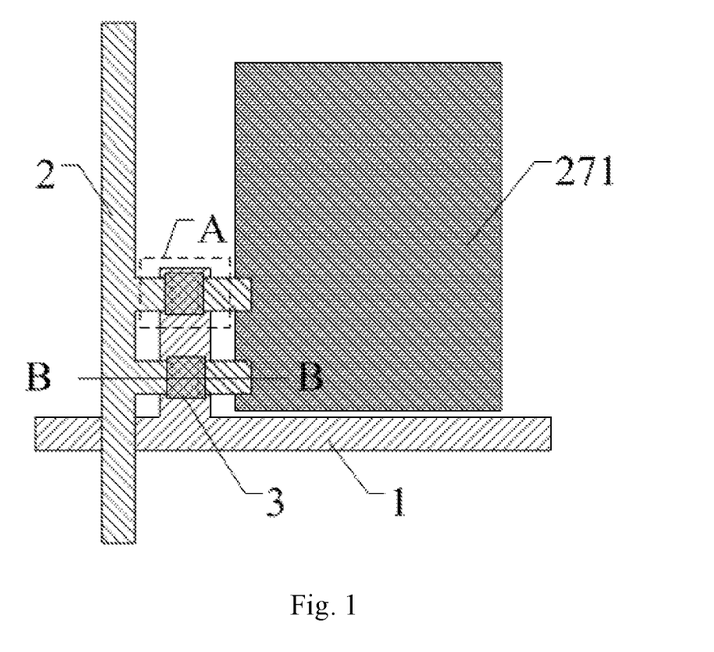
FIG. 1 is a schematic partial view of the current pixel design structure.

FIG. 1 is a schematic partial view of a current pixel design structure. As shown in FIG. 1, a subpixel region (namely a region in which a pixel unit is located) is defined by a gate line 1 and a data line 2 and a switching element is disposed in an A region. By parallel connection of, for instance, two switching elements (TFTs), when the switching element under the control of the gate line 1 and the data line 2 is in an on-state, an on-state current entering a pixel electrode 271 is increased through the switching elements. For instance, compared with a case in that only one switching element is arranged, in a case of additionally arranging another same switching element in parallel connection as shown in FIG. 1, the on-state current will be increased to twice the original on-state current. But the switching elements in parallel connection (in horizontal parallel connection along a pixel plane) will additionally occupy a space of the pixel region, and hence reduce the aperture ratio of the pixel region.

Figure 2:
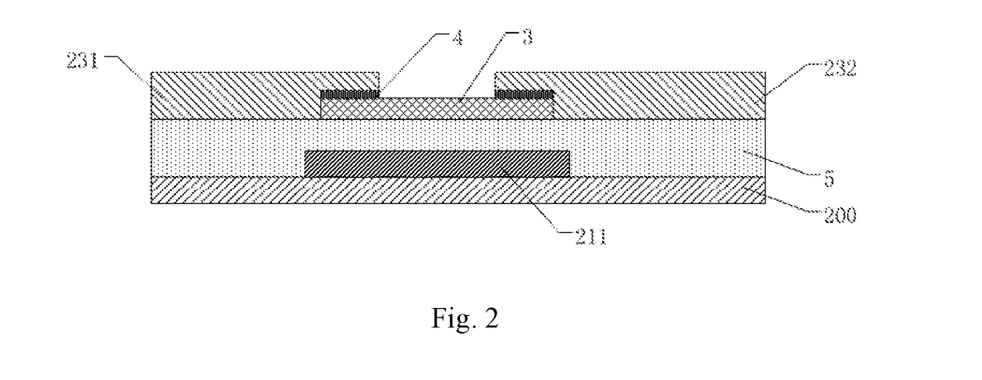
FIG. 2 is a schematic structural view of a switching element in an A region as shown in FIG. 1.

FIG. 2 is a schematic structural view of the switching element in the A region as shown in FIG. 1, and is a cross-sectional view along a B-B line in FIG. 1. As illustrated in FIG. 1, the switching element comprises a base substrate 200, and a first gate electrode 211 connected to the gate line 1, an insulating layer 5, an active layer 3, an ohmic contact layer 4 and a source-drain electrode layer (including a first electrode 231 and a second electrode 232) disposed on the base substrate 200 in sequence. The switching element is a single-layer structure. A current flowing to a pixel electrode 271 only passes through a source electrode and a drain electrode arranged in the same layer as shown in FIG. 2, an on-state current is small and cannot satisfy the requirement of rapidly charging the pixel electrode 271.

At least one embodiment of the present invention provides a switching element, a manufacturing method thereof and an array substrate to solve the above problem. The switching element comprises a base substrate, a first thin film transistor (TFT) disposed on the base substrate, and a second TFT disposed on the first TFT, wherein the first TFT includes a source-drain electrode layer, and the first TFT and the second TFT share the source-drain electrode layer. In some embodiments, two TFTs are connected in parallel up and down, so that a current of the switching element in the on-state can be increased. Moreover, the up-and-down arrangement means (the second TFT is disposed on the first TFT) can reduce the occupied space of the switching element; and meanwhile, as the two TFTs are designed to share the source-drain electrode, the manufacturing process of the switching element can be simplified. In addition, in some embodiments, the two TFTs may also be further designed to share a gate electrode, so the gate electrodes of the two TFTs can be communicated with each other without, for instance, a through hole, and hence the manufacturing process of the switching element can be further simplified.

Figure 3:
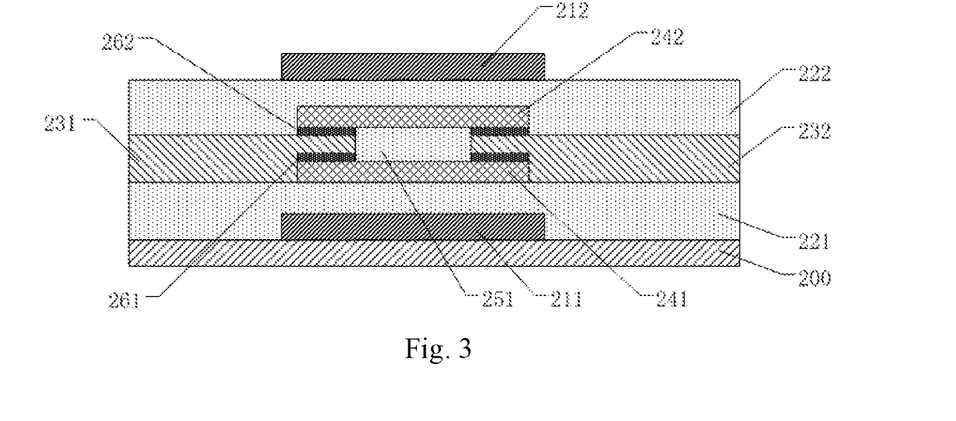
FIG. 3 is a schematic structural view of a switching element provided by one embodiment of the present invention.

An embodiment of the present invention provides a switching element. FIG. 3 is a schematic structural view of the switching element, and is a cross-sectional view. For instance, as shown in FIG. 3, the switching element comprises a base substrate 200, a first TFT disposed on the base substrate 200, and a second TFT disposed on the first TFT, wherein the first TFT includes a source-drain electrode layer; and the first TFT and the second TFT share the source-drain electrode layer. The source-drain electrode layer includes a first electrode 231 and a second electrode 232 which may be respectively a source electrode and a drain electrode.

For instance, in one example of the embodiment of the present invention, both the first TFT and the second TFT are bottom-gate TFTs. As shown in FIG. 3, the first TFT includes a first gate electrode 211, a first gate insulating layer 221 and a first active layer 241, wherein, for instance, the first gate electrode 211, the first gate insulating layer 221 and the first active layer 241 are disposed on the base substrate 200 in sequence; and the second TFT includes a second active layer 242, a second gate insulating layer 222 and a second gate electrode 212, wherein the second active layer 242, the second gate insulating layer 222 and the second gate electrode 212 are disposed on the source-drain electrode layer in sequence. The first TFT and the second TFT arranged in this manner are, for instance, symmetrically arranged relative to the source-drain electrode layer to form a parallel circuit.

It should be noted that: in all embodiments of the present invention, when the first TFT is a bottom-gate structure, it is considered that the second TFT disposed on the first TFT is also a bottom-gate structure, and correspondingly, the switching element formed by the first TFT and the second TFT may also be considered to be bottom-gate type. Similarly, in the embodiments described below, when the first TFT is a top-gate structure, it is considered that the second TFT formed on the first TFT is also a top-gate structure, and correspondingly, the switching element formed by the first TFT and the second TFT may also be considered to be top-gate type.

For instance, in the example, as shown in FIG. 3, the first TFT may also include a first ohmic contact layer 261 which is disposed between the source-drain electrode layer and the first active layer 241; and the second TFT may also include a second ohmic contact layer 262 which is disposed between the source-drain electrode layer and the second active layer 242.

For instance, the first active layer 241 and the second active layer 242 may be made from amorphous silicon (a-Si), polycrystalline silicon (poly-Si), oxide semiconductor, etc. For instance, materials of the ohmic contact layer include doped semiconductor materials, e.g., doped a-Si, poly-Si or oxide semiconductor.

For instance, in the example, as shown in FIG. 3, the switching element further comprises a first insulating layer 251. The first insulating layer 251 is disposed between the first active layer 241 and the second active layer 242 to isolate the first active layer and the second active layer, so that the first active layer and the second active layer can be insulated from each other, and hence the first TFT and the second TFT form a parallel circuit.

For instance, in the example, as shown in FIG. 3, the first gate electrode 211 and the second gate electrode 212 are, for instance, electrically connected with each other, so a signal in a gate line can simultaneously control the first TFT and the second TFT. The first gate electrode 211 and the second gate electrode 212 are arranged in different layers. In order to electrically connect the first gate electrode and the second gate electrode, for instance, the first gate electrode and the second gate electrode may be electrically connected with each other via a through hole. For instance, the through hole is formed by passing through the first gate insulating layer 221 and the second gate insulating layer 222.

Figure 4:
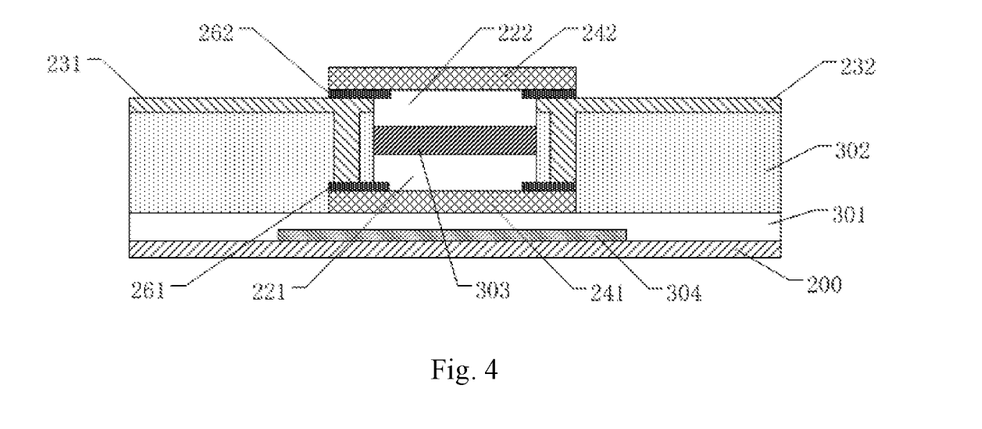
FIG. 4 is a schematic structural view of another switching element provided by one embodiment of the present invention.

For instance, in another example of the embodiment of the present invention, both the first TFT and the second TFT are top-gate type TFTs. FIG. 4 is another schematic structural view of the switching element. For instance, as shown in FIG. 4, the first TFT includes a common gate electrode 303; the first TFT and the second TFT share the common gate electrode 303; the first TFT also includes a first gate insulating layer 221 and a first active layer 241; the first gate insulating layer 221 is disposed between the first active layer 241 and the common gate electrode 303; the second TFT also includes a second gate insulating layer 222 and a second active layer 242; and the second gate insulating layer 222 is disposed between the second active layer 242 and the common gate electrode 303. In addition, the common gate electrode 303 is also disposed between the first electrode 231 and the second electrode 232 of the source-drain electrode layer. Moreover, the first electrode 231 and the second electrode 232 may be isolated from each other through an insulating layer. For instance, the insulating layer may be at least one or a combination of the first gate insulating layer 221, the second gate insulating layer 222 and a third insulating layer 302.

It should be noted that the first gate insulating layer 221 and the third insulating layer 302 are not limited to be two structures and may also be an integrated insulating layer structure, and as long as the common gate electrode 303 and the first active layer 241, the common gate electrode 303 and the first electrode 231, and the common gate electrode 303 and the second electrode 232 may be isolated from each other, the same technical effect can be achieved. In the embodiment, when the first TFT and the second TFT also share the common gate electrode 303 in the case of sharing the source-drain electrode, it is not necessary to add a through hole or other processes to connect the gate electrodes of the first TFT and the second TFT, so the first TFT and the second TFT form a parallel circuit to increase the on-state current, meanwhile the manufacturing process of the switching element can be simplified.

For instance, the switching element in the embodiment as shown in FIG. 4 may further comprise a buffer layer 301. The buffer layer 301 acts as a transition layer between the first active layer 241 and the base substrate 200, allows the first active layer 241 and the base substrate 200 to be more firmly bonded, and can prevent harmful impurities, ions and the like in the base substrate 200 from being diffused into the first active layer 241.

Forming materials of the buffer layer 301 include silicon oxide (SiOx), silicon nitride (SiNx), silicon oxynitride (SiOxNy), etc. For instance, the buffer layer 301 may be a single-layer structure made from SiNx or SiOx, or a double-layer structure formed by SiNx and SiOx.

When light emitted by a backlight source is irradiated to the active layer, photon-generated carriers may be generated and the electrical characteristic of the active layer may be damaged, for instance, the leakage current of the TFT is caused to be increased, so the TFT with top-gate type structure may also be provided with a light-shielding layer as required to shield light for the active layer. For instance, the switching element having top-gate type TFT structure in the embodiment as shown in FIG. 4 may further comprise a light shielding layer 304 disposed between the first active layer 241 and the base substrate 200. Forming materials of the light shielding layer 304, for instance, may include opaque materials such as metal and black resin.

In the embodiment, the structure, the material and the like of the first TFT and the second TFT symmetrically arranged relative to the source-drain electrode layer are completely the same. However, it should be known by those skilled in the art that the first TFT and the second TFT may also be not symmetrically arranged, namely the structure, the material and the like of the first TFT and the second TFT may be not completely the same, as long as the on-state current of the switching element formed by, for instance, two TFTs in parallel connection, is greater than the on-state current of the switching element formed by any one of two TFTs. For instance, the structure, the material and the like of the two symmetrically arranged TFTs of the switching element are completely the same, and the on-state current of the switching element is twice the on-state current of the switching element only provided with one TFT.

Another embodiment of the present invention provides an array substrate, which comprises a plurality of subpixel regions arranged in an array, wherein each subpixel region includes a gate line, a data line, a pixel electrode and the switching element provided by the above embodiment; and at least one gate line is electrically connected with the first TFT and the second TFT of the switching element. For instance, the data line is electrically connected with the first electrode (e.g., a source electrode) in the source-drain electrode layer; and the pixel electrode is electrically connected with the second electrode (e.g., a drain electrode) in the source-drain electrode layer.

Figure 5:
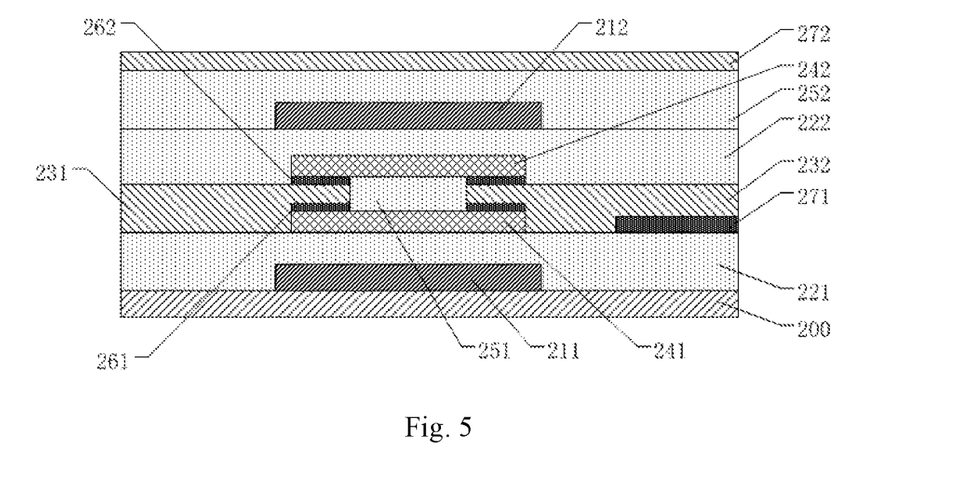
FIG. 5 is a schematic structural view of an array substrate provided by one embodiment of the present invention.

For instance, the switching element in the embodiment is a bottom-gate type structure. FIG. 5 is a schematic structural view of an array substrate provided by an embodiment of the present invention. The switching element of the array substrate is the bottom-gate type structure in the embodiment as shown in FIG. 3. For instance, as shown in FIG. 5, the array substrate may further comprise a pixel electrode 271 and a common electrode 272, wherein the pixel electrode 271 is electrically connected with the second electrodes 232; the common electrode 272 is disposed on the second gate electrode 212; and a second insulating layer 252 is disposed between the second gate electrode 212 and the common electrode 272.

In order to ensure the synchronous operation of the first TFT and the second TFT, the gate electrodes (including the first gate electrode 211 and the second gate electrode 212) of the first TFT and the second TFT needs to be electrically connected with each other, and there are many connection modes of the gate electrodes. For instance, a through hole may be formed in each pixel region, so that the first gate electrode 211 and the second gate electrode 212 may be electrically connected to the same gate line.

For instance, the array substrate provided by the embodiment of the present invention may further comprise the common electrode 272 disposed on the second insulating layer 252. The common electrode 272 is configured to be matched with the pixel electrode 271 to form a working electric field, so as to control, for instance, the deflection of liquid crystal molecules. In other examples, the array substrate may be only provided with the pixel electrode but not provided with the common electrode matched with the pixel electrode, for instance, when the array substrate is applied to a vertical electric field type LCD, an OLED display device or an e-paper display device.

For instance, the array substrate provided by the embodiment of the present invention may further comprise a first gate line and a second gate line arranged in different layers, wherein the first gate line is electrically connected with the first gate electrode 211 of the first TFT arranged in the same layer; the second gate line is electrically connected with the second gate electrode 212 of the second TFT arranged in the same layer; and the first gate line and the second gate line are electrically connected with each other.

For instance, a through hole may be formed in a pixel region of a display region of the array substrate, and the first gate line and the second gate line are electrically connected with each other via the through hole. Moreover, for instance, the first gate line and the second gate line are parallel to each other and overlapped up and down, and electrically connected with each other through at least one through hole formed in a peripheral region (non-display region) of the array substrate.

The switching element in the array substrate provided by the embodiment is not limited to the bottom-gate type as shown in FIG. 3, and the top-gate type switching element as shown in FIG. 4 may also achieve same technical effects. In addition, the number of the TFTs in the switching element is not limited to be two, and the switching element may include a plurality of TFTs connected in parallel up and down.

An embodiment of the present invention provides a method for manufacturing a switching element. The manufacturing method comprises: providing a base substrate; forming a first TFT on the base substrate; and forming a second TFT on a layer in which the first TFT is disposed, wherein the first TFT includes a source-drain electrode layer; and the first TFT and the second TFT share the source-drain electrode layer.

For instance, in the manufacturing method provided by the embodiment of the present invention, forming the first TFT and the second TFT includes: forming a first gate electrode, a first gate insulating layer, a first active layer and the source-drain electrode layer on the base substrate in sequence; and forming a second active layer, a second gate insulating layer and a second gate electrode on the source-drain electrode layer in sequence.

For instance, the manufacturing method provided by the embodiment of the present invention may further comprise forming a first insulating layer between the first active layer and the second active layer.

For instance, in the manufacturing method provided by the embodiment of the present invention, forming the first TFT and the second TFT includes: forming a first active layer, a source-drain electrode layer, a first gate insulating layer and a common gate electrode on the base substrate in sequence; and forming a second gate insulating layer and a second active layer on the common gate electrode in sequence, wherein the first gate insulating layer is disposed between the first active layer and the common gate electrode; and the second gate insulating layer is disposed between the second active layer and the common gate electrode.

For instance, the manufacturing method provided by the embodiment of the present invention may further comprise: forming a first ohmic contact layer between the source-drain electrode layer and the first active layer; and forming a second ohmic contact layer between the source-drain electrode layer and the second active layer.

The TFT of the switching element in the embodiment may be the bottom-gate or top-gate type structure in the above embodiment. For the convenience of understanding, the embodiment provides a manufacturing process of a switching element being one type structure as an example. For instance, one example in the embodiment provides a manufacturing process of a bottom-gate type switching element. FIGS. 6a-6j are process diagrams of a method for manufacturing a bottom-gate type switching element, provided by an embodiment of the present invention. As shown in FIGS. 6a-6j, one example of the manufacturing process of the switching element, provided by the embodiment, comprises the following steps.

Figure 6A:
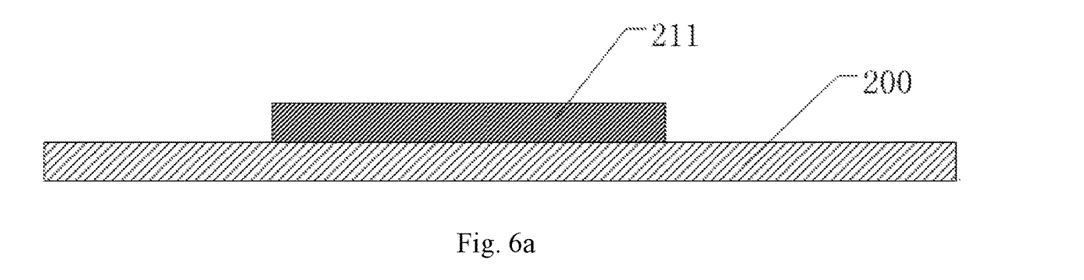
FIGS. 6a-6j are diagrams illustrating the processes of a method for manufacturing a switching element, provided by one embodiment of the present invention.

As shown in FIG. 6a, a base substrate 200 is provided, and a layer of a first gate electrode film is deposited on the base substrate 200 and is patterned to form a first gate electrode 211. For instance, the base substrate 200 may be a glass substrate.

For instance, materials of the first gate electrode 211 may be copper (Cu)-base metal, e.g., Cu, copper-molybdenum alloy (Cu/Mo), copper-titanium alloy (Cu/Ti), copper-molybdenum-titanium alloy (Cu/Mo/Ti), copper-molybdenum-tungsten alloy (Cu/Mo/W) or copper-molybdenum-niobium alloy (Cu/Mo/Nb); the materials of the first gate electrode 211 may also be chromium (Cr)-base metal, e.g., chromium-molybdenum alloy (Cr/Mo), chromium-titanium alloy (Cr/Ti) or chromium-molybdenum-titanium alloy (Cr/Mo/Ti); and the materials of the first gate electrode 211 may also be aluminum (Al) or Al alloy, etc.

In the embodiment, the patterning process may be, for instance, photolithographic patterning process, and for instance, includes: coating a photoresist layer on a structural layer required to be patterned; performing exposure on the photoresist layer by using a mask; obtaining photoresist pattern by performing development on the exposed photoresist layer; etching the structural layer by using the photoresist pattern; and optionally removing the photoresist pattern.

Figure 6B:
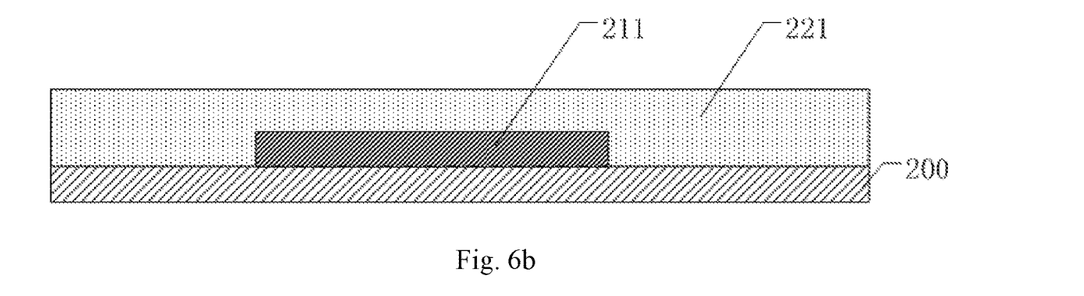

As shown in FIG. 6b, a first gate insulating layer 221 is deposited on the base substrate 200 on which the first gate electrode 211 is formed. For instance, materials for preparing the first gate insulating layer 221 include SiNx, SiOx, aluminum oxide ($Al_2O_3$), aluminum nitride (AlN) or other suitable materials.

Figure 6C:
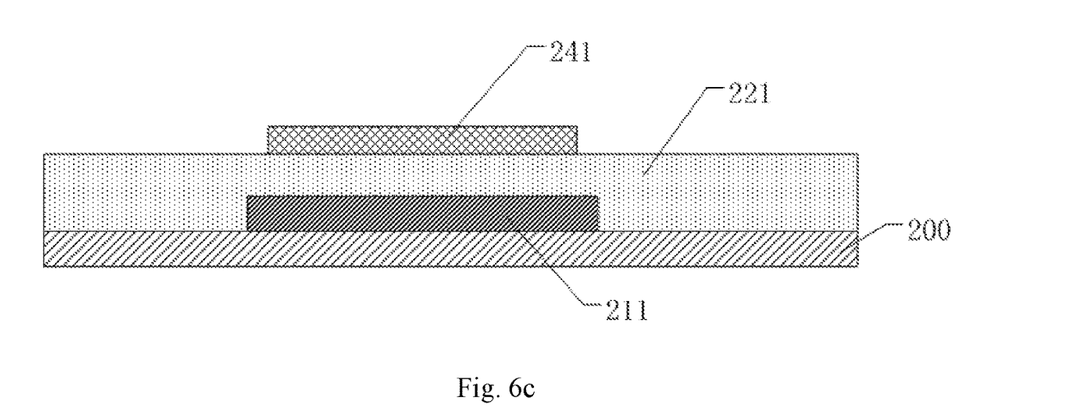

As shown in FIG. 6c, a layer of a first active layer film is deposited on the first gate insulating layer 221, and then is patterned to form the first active layer 241. For instance, materials for preparing the active layer 241 include a-Si, poly-Si and metal oxide such as indium gallium zinc oxide (IGZO), indium zinc oxide (IZO), zinc oxide (ZnO) and gallium zinc oxide (GZO).

Figure 6D:
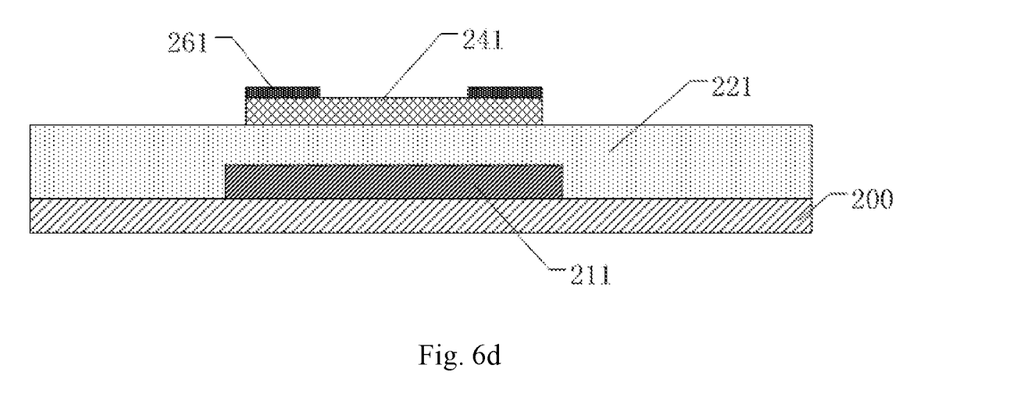

As shown in FIG. 6d, a layer of a first ohmic contact layer film is deposited on the base substrate 200 on which the first active layer 241 is formed, and is patterned to form the first ohmic contact layer 261. For instance, materials for preparing the first ohmic contact layer 261 include doped a-Si, poly-Si and oxide semiconductor.

Figure 6E:
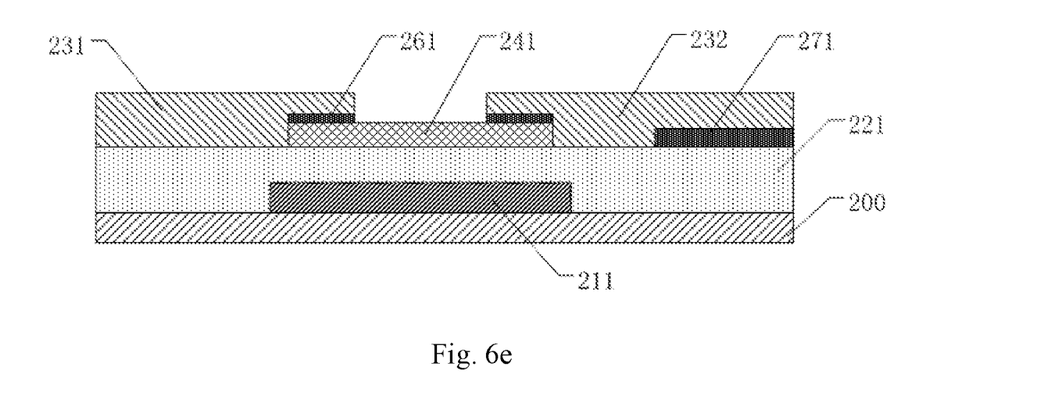

As shown in FIG. 6e, a layer of a source-drain electrode layer film is deposited on the base substrate 200 on which the first ohmic contact layer 261 is formed, and is patterned to form the source-drain electrode layer (including the first electrode 231 and the second electrode 232).

For instance, the source-drain electrode layer may be made from metallic materials and may be a single-layer or multi-layer structure, for instance, a single-layer Al structure, a single-layer molybdenum (Mo) structure or a three-layer structure comprising one layer of Al between two layers of Mo.

Figure 6F:
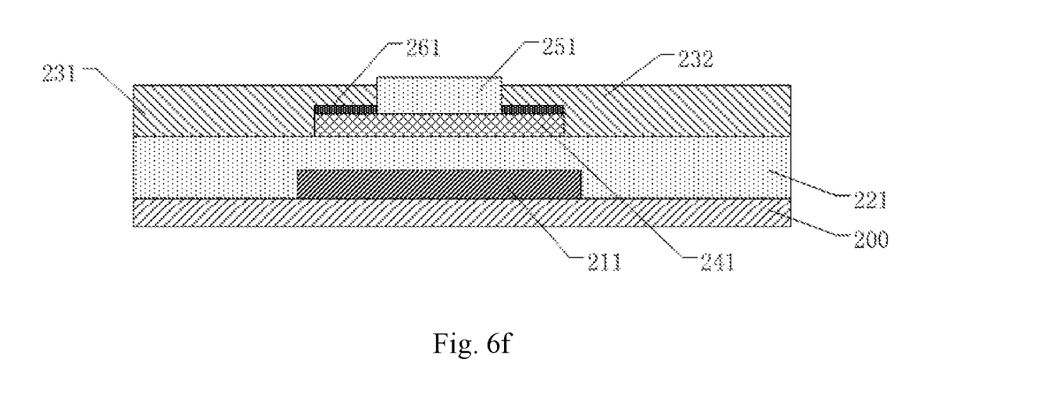

As shown in FIG. 6f, a layer of a first insulating layer film is deposited on the base substrate 200 on which the source-drain electrode layer is formed, and is patterned to form the first insulating layer 251. The first insulating layer 251 is disposed above the first active layer 241 and disposed between the first electrode 231 and the second electrode 232. Materials of the first insulating layer 251 are SiNx, SiOx, etc.

Figure 6G:
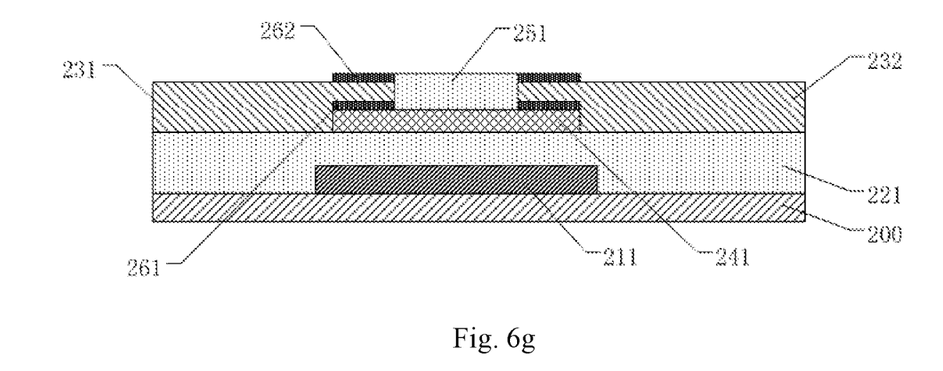

As shown in FIG. 6g, a layer of a second ohmic contact layer 262 is deposited on the base substrate 200 on which the first insulating layer 251 is formed, and is patterned to form the second ohmic contact layer 262. For instance, materials for preparing the second ohmic contact layer 262 include doped semiconductor materials, e.g., doped a-Si, poly-Si or oxide semiconductor.

Figure 6H:
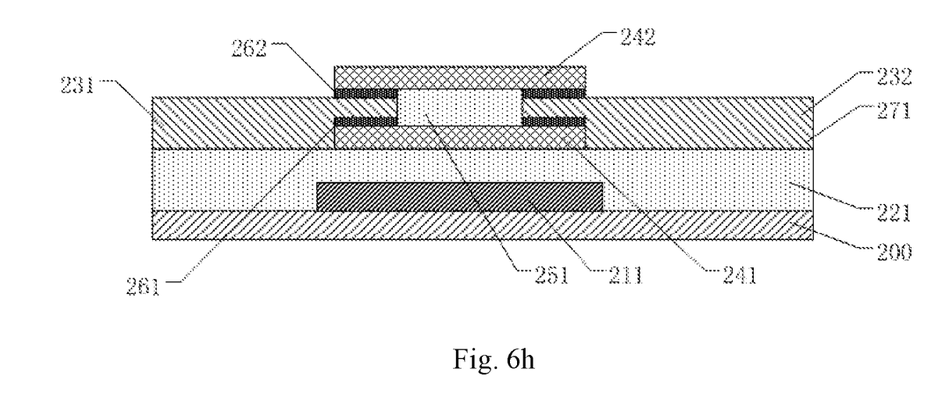

As shown in FIG. 6h, a layer of a second active layer film is deposited on the base substrate 200 on which the second ohmic contact layer 262 is formed, and is patterned to form the second active layer 242. For instance, materials for preparing the active layer 242 include amorphous silicon, polycrystalline silicon and metal oxide, such as, IGZO, IZO, ZnO or GZO.

Figure 6I:
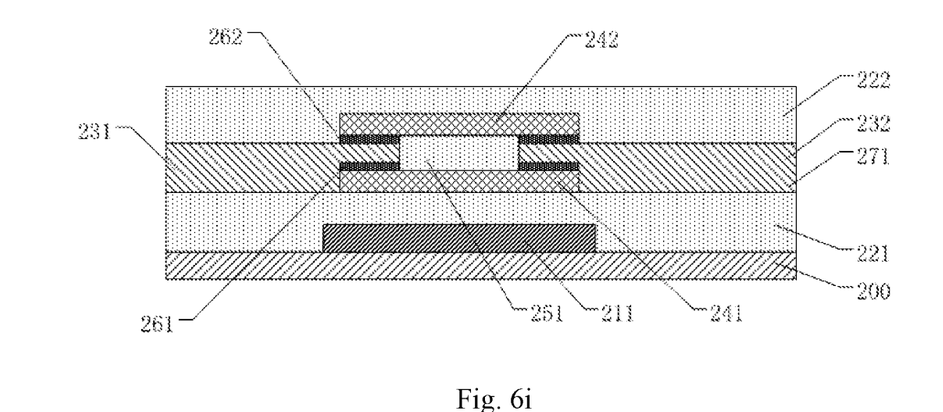

As shown in FIG. 6i, a layer of a second gate insulating layer 222 is deposited on the base substrate 200 provided with the second active layer 242. For instance, materials for preparing the second gate insulating layer 222 include SiNx, SiOx, $Al_2O_3$, AlN or other suitable materials.

Figure 6J:
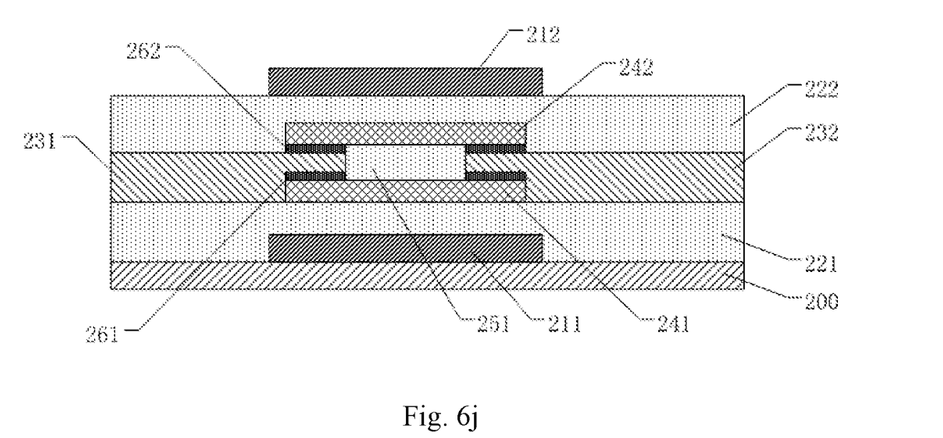

As shown in FIG. 6j, a layer of a second gate electrode film is deposited on the second gate insulating layer 222, and is patterned to form a second gate electrode 212. For instance, materials of the second gate electrode 212 may be Cu-base metal such as Cu, Cu/Mo, Cu/Ti, Cu/Mo/Ti, Cu/Mo/W or Cu/Mo/Nb; materials of the second gate electrode 212 may also be Cr-base metal such as Cr/Mo, Cr/Ti or Cr/Mo/Ti; and materials of the second gate electrode 212 may also be Al, Al alloy, etc.

In the embodiment, the first TFT and the second TFT are symmetrically arranged. For instance, the active layer, the ohmic contact layer, the gate insulating layer, the gate electrode and the like symmetrically arranged relative to the source-drain electrode layer may be same or different structures and may also be made from same or different materials, and the technical effect of increasing the on-state current of the switching element can be achieved as long as the first TFT structure and the second TFT structure are arranged in parallel connection up and down.

Figure 6K:
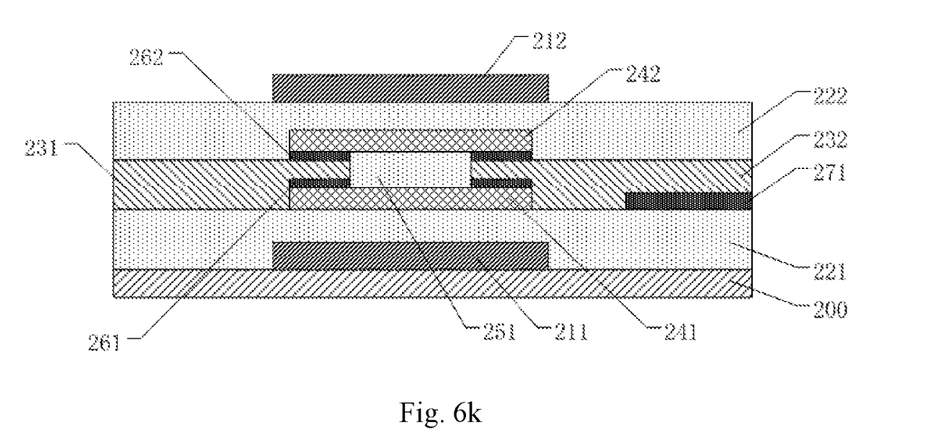
FIGS. 6k-6m are diagrams illustrating the processes of a method for manufacturing an array substrate, provided by one embodiment of the present invention.
Figure 6L:
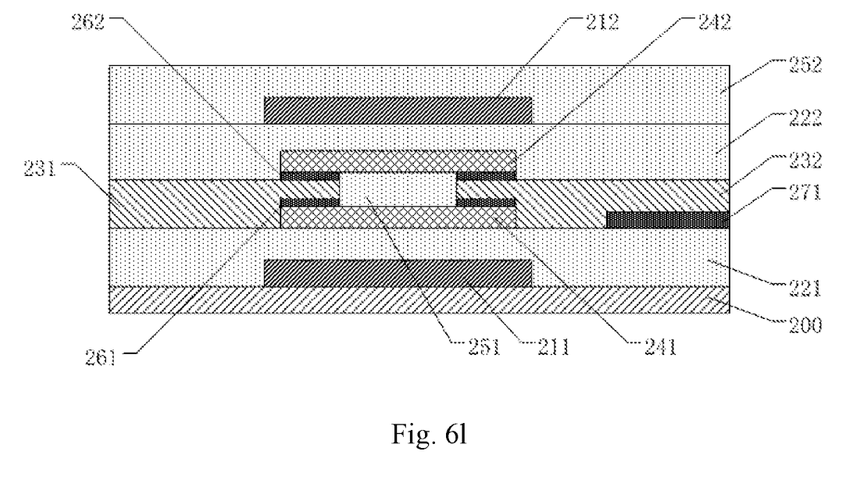
Figure 6M:
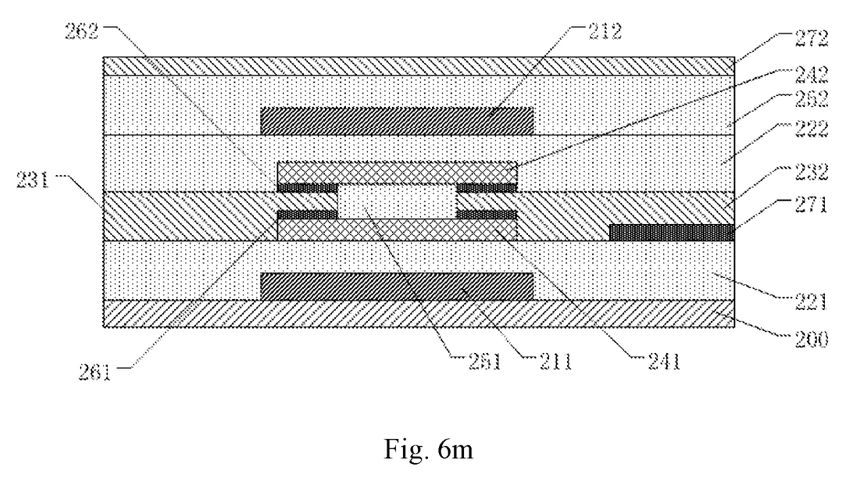

Another embodiment of the present invention provides a method for manufacturing an array substrate. FIGS. 6k-6m are process diagrams of a method for manufacturing an array substrate, provided by an embodiment of the present invention. The manufacturing method comprises the subsequent manufacturing processes after manufacturing the switching element provided by the above embodiment, wherein the switching element is not limited to be bottom-gate type structure, and the top-gate type switching element may also achieve the same technical effects. For the convenience of understanding, the manufacturing process of the array substrate is given in one example of the embodiment by taking the bottom-gate type switching element as an example. As shown in FIGS. 6k-6m, one example of the manufacturing process of the array substrate provided by the embodiment includes the following steps.

As shown in FIG. 6k, the manufacturing process of the switching element further includes: forming a pixel electrode film between the source-drain electrode layer, e.g., the second electrode 232, and the first gate insulating layer 221, and forming a pixel electrode 271 by patterning the pixel electrode film. The pixel electrode 271 is directly electrically connected with the second electrode 232.

For instance, the pixel electrode 271 is made from transparent conductive materials or metallic materials. For instance, materials for forming the pixel electrode 271 include indium tin oxide (ITO), IZO, indium gallium oxide (IGO), GZO, ZnO, indium oxide ($In_2O_3$), aluminum zinc oxide (AZO), carbon nanotubes, etc.

The pixel electrode 271 is not limited to be formed between the second electrode 232 and the first gate insulating layer 221. There are many means for achieving the electrical connection between the pixel electrode 271 and the second electrode 232. For instance, the pixel electrode may also be formed between the second electrode 232 and the second gate insulating layer 222 and electrically connected with the second electrode 232. The pixel electrode may also be formed on the second gate insulating layer 222, a through hole is formed in the second gate insulating layer 222, and the second electrode 232 is electrically connected with the pixel electrode 271 via the through hole.

As shown in FIG. 6l, a layer of a second insulating layer 252 is formed on the base substrate 200 provided with the second gate electrode 212.

As shown in FIG. 6m, a layer of a common electrode 272 is formed on the second insulating layer 252. A working electric field is formed by the common electrode 272 and the pixel electrode 271, so as to control the deflection of liquid crystals in LCD.

Another embodiment of the present invention provides a display device, which comprises the array substrate provided by any foregoing embodiment.

One example of the display device is an LCD device. The LCD device comprises an array substrate and an opposed substrate which are arranged opposite to each other to form a liquid crystal cell, and liquid crystal materials are filled in the liquid crystal cell. The opposed substrate is, for instance, a color filter (CF) substrate. A pixel electrode in each pixel unit of the array substrate is configured to apply an electric field to control the rotation degree of the liquid crystal materials, so as to achieve display.

Another example of the display device is an OLED display device, wherein a stacked layer of an organic light-emitting material is formed on an array substrate; and a pixel electrode of each pixel unit is taken as an anode or a cathode and configured to drive the organic light-emitting material to emit light, so as to achieve display.

Still another example of the display device is e-paper display device, wherein an electronic ink layer is formed on an array substrate; and a pixel electrode of each pixel unit is configured to apply voltage for driving charged microparticles in electronic ink to move, so as to achieve display.

Embodiments of the present invention provide a switching element, a manufacturing method thereof, an array substrate and a display device, which have one of the following advantages:

(1) In the switching element, the two TFTs are arranged in parallel connection up and down, so as to increase the on-state current and meanwhile reduce the occupied space.

(2) The two TFTs of the switching element share the source-drain electrode layer, so as to simplify the manufacturing process of the switching element and reduce the cost.

The following points should be noted:

(1) The accompanying drawings in the embodiments of the present invention only involve structures relevant to the embodiments of the present invention, and other structures may refer to the prior art.

(2) For clarity, in the accompanying drawings of the embodiments of the present invention, the thickness of layers or regions is enlarged or reduced, namely the accompanying drawings are not drawn according to actual scales.

(3) The embodiments of the present invention and the characteristics in the embodiments may be mutually combined to obtain new embodiments without conflict.

The foregoing is only the preferred embodiments of the present invention and not intended to limit the scope of protection of the present invention. The scope of protection of the present invention should be defined by the appended claims.

The application claims priority to the Chinese patent application No. 201611091732.1, filed Dec. 1, 2016, the disclosure of which is incorporated herein by reference as part of the application.

The invention claimed is:

1. A switching element, comprising:
    a base substrate;
    a first thin-film transistor (TFT), disposed on the base substrate;
    a second TFT, disposed on the first TFT,
    wherein the first TFT includes a first electrode and a second electrode, and the first TFT and the second TFT share the first electrode and the second electrode,
    the first TFT includes a common gate electrode, the first TFT and the second TFT share the common gate electrode,
    the first TFT further includes a first gate insulating layer and a first active layer, the first gate insulating layer is disposed between the first active layer and the common gate electrode, and
    the second TFT further includes a second gate insulating layer and a second active layer, and the second gate insulating layer is disposed between the second active layer and the common gate electrode,
    a first ohmic contact layer, disposed between the first electrode and the second electrode and the first active layer; and
    a second ohmic contact layer, disposed between the first electrode and the second electrode and the second active layer,
    wherein the first active layer is disposed on the base substrate, the common gate electrode is disposed between the first gate insulating layer and the second gate insulating layer, the first electrode and the second electrode are between the first active layer and the second active layer.

2. The switching element according to claim 1, further comprising a buffer layer which is disposed on the base substrate,
    wherein the first active layer is disposed on the buffer layer, the first TFT and the second TFT are disposed on the buffer layer.

3. The switching element according to claim 1, wherein the first active layer is disposed on the buffer layer, the first ohmic contact layer and the first gate insulating layer are disposed on the first active layer, the first electrode and the second electrode are disposed on and directly contact the first ohmic contact layer, the common gate electrode is disposed on the first gate insulating layer, the second gate insulating layer is disposed on the common gate electrode, the second ohmic contact layer is disposed on the second gate insulating layer and the first electrode and the second electrode, and the second active layer is disposed on the second gate insulating layer and the second ohmic contact layer.

4. The switching element according to claim 1, wherein the first electrode and the second electrode are disposed in an identical layer, a first orthographic projection of the common gate electrode on the base substrate is located between a second orthographic projection of the first electrode and a third orthographic projection of the second electrode on the base substrate, and the first orthographic projection is not overlapped with the second orthographic projection and the third orthographic projection.

5. The switching element according to claim 1, wherein the first electrode and the second electrode comprise first portions overlapped with the first active layer and the second active layer and extension portions, a sum of a thickness of the first portion and thicknesses of the first ohmic contact layer and the second ohmic contact layer is equal to a sum of thicknesses of the common gate electrode, the first gate insulating layer and the second gate insulating layer.

6. The switching element according to claim 5, wherein an upper surface of the first portion of the first electrode and an upper surface of the first portion of the second electrode are coplanar, and a lower surface of the first portion of the first electrode and a lower surface of the first portion of the second electrode are coplanar.

7. The switching element according to claim 6, wherein cross-section shapes of the first electrode and the second electrode are T-like shapes.

8. The switching element according to claim 7, wherein the T-like shape is a normal T-like shape or an inverse T-like shape.

9. The switching element according to claim 1, wherein side edges of the first ohmic contact layer away from the common gate electrode are aligned with side edges of the first active layer, and side edges of the second ohmic contact layer away from the common gate electrode are aligned with side edges of the second active layer.

10. The switching element according to claim 1, wherein the first ohmic contact layer directly contacts the first gate insulating layer, and the second ohmic contact layer directly contacts the second gate insulating layer.

11. The switching element according to claim 1, wherein in a direction parallel to a plane on which the base substrate is disposed, a first insulating layer is disposed between the first electrode and the common gate electrode, and a second insulating layer is disposed between the second electrode and the common gate electrode.

12. The switching element according to claim 11, wherein heights of the first-insulating layer and the second insulating layer are less than heights of the first electrode and the second electrode.

13. The switching element according to claim 1, wherein orthographic projections of the first active layer and the second active layer on the base substrate coincide, orthographic projections of the first ohmic contact layer and the second ohmic contact layer on the base substrate coincide, orthographic projections of the first gate insulating layer and the second gate insulating layer coincide.

14. The switching element according to claim 1, wherein in a direction parallel to a plane on which the base substrate is disposed, the first ohmic contact layer and the second ohmic contact layer extend toward the common gate electrode and go beyond the first electrode and the second electrode, and partially overlap with the common gate electrode.

15. An array substrate, comprising a plurality of subpixel units, wherein each of the plurality of subpixel units includes at least one gate line, a data line, a pixel electrode and the switching element according to claim 1; and
the at least one gate line is electrically connected with the first TFT and the second TFT of the switching element, the data line is electrically connected with the first electrode, and the pixel electrode is electrically connected with the second electrode.

16. A display device, comprising the array substrate according to claim 15.

17. The display device according to claim 16, wherein the display device is a liquid crystal display (LCD) device, an organic light-emitting diode (OLED) display device or an e-paper display device.

18. A method for manufacturing a switching element, comprising:
providing a base substrate;
forming a first TFT on the base substrate; and
forming a second TFT on the first TFT, wherein
the first TFT includes a first electrode and a second electrode, and the first TFT and the second TFT share the first electrode and the second electrode,
wherein the forming the first TFT and the second TFT includes:
forming a first active layer, the first electrode, the second electrode, a first gate insulating layer and a common gate electrode on the base substrate in sequence; and
forming a second gate insulating layer and a second active layer on the common gate electrode in sequence,
wherein the first gate insulating layer is disposed between the first active layer and the common gate electrode, and the second gate insulating layer is disposed between the second active layer and the common gate electrode,
wherein the method for manufacturing further comprises:
forming a first ohmic contact layer between the first electrode and the second electrode and the first active layer; and
forming a second ohmic contact layer between the first electrode and the second electrode and the second active layer,
wherein the first active layer is disposed on the base substrate, the common gate electrode is disposed between the first gate insulating layer and the second gate insulating layer, and the first electrode and the second electrode are between the first active layer and the second active layer.

* * * * *